United States Patent [19]
Johnston

[11] Patent Number: 5,898,217
[45] Date of Patent: Apr. 27, 1999

[54] SEMICONDUCTOR DEVICE INCLUDING A SUBSTRATE HAVING CLUSTERED INTERCONNECTS

[75] Inventor: Patrick Johnston, Austin, Tex.

[73] Assignee: Motorola, Inc., Schaumburg, Ill.

[21] Appl. No.: 09/002,610

[22] Filed: Jan. 5, 1998

[51] Int. Cl.[6] .......................... H01L 23/52; H01L 23/48; H01L 23/04

[52] U.S. Cl. .................. 257/691; 257/690; 257/693; 257/698

[58] Field of Search ............................ 257/690, 691, 257/693, 698

[56] References Cited

U.S. PATENT DOCUMENTS

| | | | |
|---|---|---|---|
| 5,708,296 | 1/1998 | Bhansali | 257/698 |
| 5,714,801 | 2/1998 | Yano et al. | 257/691 |
| 5,763,947 | 6/1998 | Bartley | 257/693 |

FOREIGN PATENT DOCUMENTS

| | | | |
|---|---|---|---|
| 63-220558 | 9/1988 | Japan | 257/691 |
| 1-114059 | 5/1989 | Japan | 257/698 |

Primary Examiner—Mahshid Saadat
Assistant Examiner—Jhihan B. Clark
Attorney, Agent, or Firm—Jeffrey S. Abel

[57] ABSTRACT

A semiconductor device (100) including a die (110) electrically connected to a substrate (120), wherein the substrate has a novel interconnect routing structure. The routing structure has a plurality of interconnects (122) including a plurality of intermediate vias (140), including both intermediate vias associated with supply interconnects and signal interconnects, that are clustered together to reduce undesirable mutual loop inductance ($L_m$) and reduce switching noise ($\Delta I$). A plurality of first printed wires (128a) and a plurality of second printed wires (128b) may incorporated in the substrate for routing of the plurality intermediate vias in cluster form. The substrate may have a plurality of clusters of the intermediate vias.

26 Claims, 2 Drawing Sheets

SEMICONDUCTOR DEVICE INCLUDING A SUBSTRATE HAVING CLUSTERED INTERCONNECTS

FIELD OF THE INVENTION

The present invention is drawn to a packaged semiconductor device, particularly, a novel package substrate for the packaged semiconductor device.

BACKGROUND OF THE INVENTION

As is known in the art, modern semiconductor packages take on various forms, including pin grid arrays (PGAs), ball grid arrays (BGAs), die-scale packages (CSPs), etc. In such types of packages, the semiconductor die may be flip-chip mounted to a substrate, wherein the active surface of the semiconductor die is bumped and bonded to an underlying substrate, and wire-bonded to the substrate, wherein bond pads formed on the active surface of the substrate are connected to conjugate bond pads on a substrate via wire-bonds. The substrates for such types of packages may take on various forms, including ceramic, plastic, and metal having an insulating coating (so called "metal core substrates"). As is known in the art, the substrate includes a plurality of interconnects that electrically interconnect die terminals to respective substrate terminals, the substrate terminals being arranged in an array fashion at a relatively large pitch for electrical connection to a printed circuit board, for example. This type of structure is more clearly shown in connection with FIG. 1, described below.

FIG. 1 depicts a packaged semiconductor device 1 including semiconductor die 10 which is provided on and electrically connected to substrate 20. As is known in the art, the semiconductor die 10 includes a semiconducting substrate, such as doped silicon, on which is formed a plurality (i.e., literally thousands) of transistors. A plurality of dielectric layers and higher-level metal layers are lithographically defined and deposited on the semiconducting substrate so as to form a complete semiconductor die, which is coated with a passivation layer. The particular details of the semiconductor die are known in the art and are not essential for an understanding of the structure shown in FIG. 1. Semiconductor die 10 includes a plurality of die terminals 12 that electrically connect the semiconductor die 10 to the substrate 20. The die terminals 12 are formed to overlie an active surface of the die. The die terminals shown include die pads 14, on which are formed solder bumps 13 by the known Controlled Collapse Chip Connection (C4) technology. The die terminals 12 are electrically connected to substrate pads 21. The die pads 14 include signal pads 14a (also known as I/O pads), power pads 14b, and ground pads 14c, the power and ground pads 14b and 14c collectively forming supply pads.

The die terminals 12 provide electrical and mechanical connection by reflow of the solder material of the solder bumps 13 with a flux so as to provide electrical connection between the semiconductor die 10 and the substrate.

Turning to the substrate 20, a plurality of interconnects 22 are provided to effect electrical connection between the die terminals 12 and substrate terminals 30. The interconnects include signal interconnects 22a, power interconnects 22b, and ground interconnects 22c. The power and ground interconnects 22b and 22c are generically referred to as supply interconnects. Each interconnect 22 includes die-scale vias 24 which are connected to respective printed wires 28, and to respective package-scale vias 26. The die-scale vias 24 are arranged at a pitch corresponding to the pitch of the die terminals 12, which is a relatively fine pitch. The printed wires 28 are provided in respective layers of the substrate, and serve to fan-out electrical connection to package-scale vias 26, which are arranged at a pitch greater than die-scale vias 24. In the structure shown in FIG. 1, the substrate is formed of a plurality of ceramic layers, wherein the printed wires 28 are formed on respective ceramic layers, and vias 24 and 26 are lithographically defined and formed. The printed wires 28 take the form of printed lines when formed as a component of a signal interconnect 22a, but take the form of ground planes and power planes when used in connection with ground interconnects and power interconnects, 22b and 22c, respectively.

Substrate terminals 30 include signal terminals 30a, power terminals 30b, and ground terminals 30c. Power terminals 30b and ground terminals 30c are collectively described as supply terminals. In the structure shown in FIG. 1, the substrate terminals 30 include landing pads 32, having associated solder balls 34 for electrical connection to a printed circuit board.

The present inventor has recognized numerous shortcomings with the prior art semiconductor device depicted in FIG. 1. Particularly, it has been found that the substrate is responsible for a certain degree of switching noise, caused by relatively high mutual loop inductance ($L_m$) between supply interconnects and signal interconnects. Accordingly, a need exists in the art to provide an improved packaged semiconductor device, particularly, an improved interconnect structure of a substrate of the packaged semiconductor device, for reducing mutual loop inductance ($L_m$).

Figure 1:
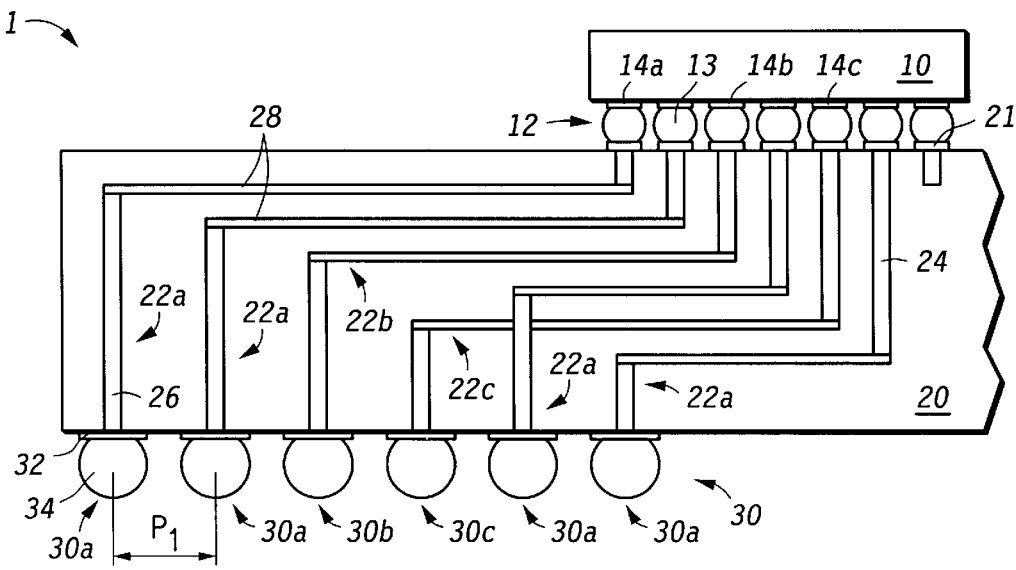
FIG. 1 is a cross-sectional view of a semiconductor device according to the prior art, illustrating the interconnect routing structure of the substrate.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

Figure 2:
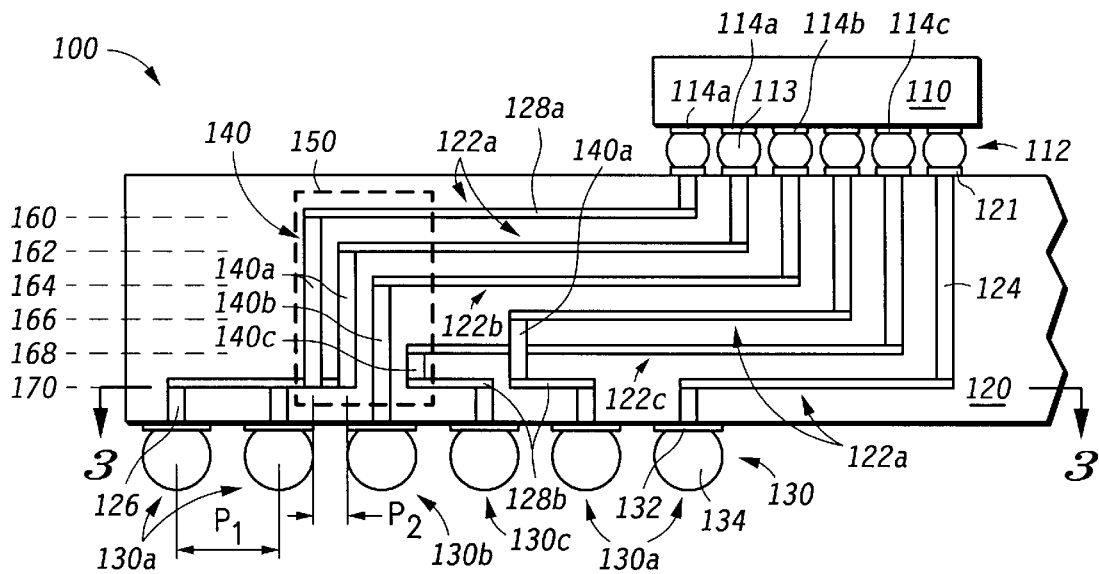
FIG. 2 is a cross-sectional view of an embodiment of the present invention, illustrating a novel interconnect routing structure according to the present invention.

FIG. 2 depicts a semiconductor device 100 including a semiconductor die 110, which is provided on and electrically connected to substrate 120. Like the semiconductor device described above with respect to FIG. 1, the semiconductor die 110 is generally formed of a semiconducting substrate on which is formed a large number of transistors, the substrate carrying a plurality of dielectric layers and metal interconnect layers (and vias) to interconnect the transistors formed on the substrate. Again, the particular details of the semiconductor die 110 are not particularly important for an understanding of the present invention. As shown, the semiconductor die 110 includes a plurality of die terminals 112 that electrically connect the semiconductor die 110 to the substrate 120. The die terminals 112 are formed to overlie an active surface of the die. The die terminals include die pads 114, on which are formed solder bumps 113 by the known C4 process. The die terminals 112 are electrically connected to substrate pads 121, thereby providing electrical connection between the semiconductor die 110 and the substrate 120. The die pads 114 include signal pads 114a (also known as I/O pads), power pads 114b, and ground pads 114c. The power and ground pads 114b and 114c collectively form supply pads. According to the embodiment shown in FIG. 2, the die terminals 112 provide electrical and mechanical connection between the semiconductor die 110 and the substrate 120 by reflow of the solder material that makes up the solder bumps 113. It is noted that the die terminals 112 may be formed by techniques other than C4. For example, the solder bumps 113 may be formed by screen printing or the like. In addition, the solder bumps may be replaced altogether with wire bonds to form a wire bond-type package, wherein wire bonds interconnect pads on the die with pads on the substrate to effect electrical connection therebetween.

The substrate 120 has a first surface on which the semiconductor die 110 is placed. The substrate 120 is formed of multiple ceramic layers, the interfaces between the layers forming planes along which printed wires run, described in more detail below. An interconnect routing structure is provided to provide electrical connection from the die terminals 112 along the first surface of the substrate 120, to a plurality of substrate terminals 130 provided along a second, opposite surface of the substrate 120. Particularly, a plurality of interconnects 122 are formed to route from the first surface of the substrate through the substrate, and to the second surface of the substrate on which the substrate terminals 130 are provided. The interconnects 122 are divided into several groups, including signal interconnects 122a, power interconnects 122b, and ground interconnects 122c. The power and ground interconnects 122b and 122c are generically referred to as supply interconnects. It is noted that the supply interconnects are globally connected to all active circuitry of the semiconductor die, while the signal interconnects are selectively connected to only some active devices. For example, in metal oxide semiconductor (MOS) devices, the signal interconnects are generally connected to gates, while the supply interconnects are connected to source and drains of the transistors. In addition, the signal interconnects carry signals that switch logic states during operation, while the supply interconnects carry signals that are static during operation.

As illustrated, each interconnect 122 includes a die-scale via 124 which is connected to a respective first printed wire 128a, an intermediate via 140 (described in more detail below), a second printed wire 128b, and finally to a package-scale via 126 which makes electrical contact with substrate terminals 130. The die-scale vias 124 are arranged in a regular array fashion, at a pitch corresponding to the pitch of the die terminals 112, which is relatively fine as compared to the pitch $P_1$ of the array of substrate terminals 30, and corresponding package-scale vias 126.

According to the embodiment of the present invention illustrated in FIG. 2, the first printed wires 128a redistribute electrical connection through the substrate such that a cluster 150 of intermediate vias 140 is formed. The cluster 150 includes of signal intermediate vias 140a, power intermediate via 140b, and ground intermediate via 140c associated with signal interconnects 122a, power interconnect 122b, and ground interconnect 122c. Power intermediate vias 140b and ground intermediate vias 140c are collectively referred to as supply intermediate vias. In the cluster 150, adjacent intermediate vias 140 are spaced apart by a distance which is less than the distance separating adjacent substrate terminals 30 from each other. The relatively tight clustering of the intermediate vias 140 is made possible by combining first printed wires 128a and second printed wires 128b so as to provide a plurality of local clusters of intermediate vias, as shown more clearly in FIG. 3 described in more detail below.

As noted above, the substrate 120 is formed of a plurality of ceramic layers, the interfaces between the layers defining a first signal plane 160, a second signal plane 162, a power plane 164, a third signal plane 166, a ground plane 168, and a fourth signal plane 170. It is along these planes that the printed wires 128a and 128b extend. The printed wires 128a and 128b associated with the signal interconnects generally take on the form of finely divided printed lines, while in contrast, the printed wires 128a and 128b of the power and ground interconnects 122b and 122c take on the form of respective common conductive planes to which all power and ground interconnects 122b and 122c are respectively connected. By use of common conductive planes, the power interconnects are all at substantially the same potential and the ground interconnects are all at substantially the same potential. While the substrate 120 is formed of ceramic (e.g., 90 to 99% alumina) by conventional process steps, it is noted that other materials may be utilized for forming the substrate as known in the art. For example, an organic resin substrate or an insulated metal core substrate may be utilized. In addition, while die-scale vias 124 interconnect the first printed wires 128a to the die terminals 112, such die-scale vias may be eliminated. In such a case, the printed wires 128a would extend along the first, top surface of the substrate 120 achieve clustering of intermediate vias 140. Similarly, the package-scale vias 126 may be eliminated. In these cases, where the die-scale vias and/or package scale vias are wholly or partially eliminated, portions of second wires 128a, 128b would form appropriate sites for formation of terminals. That is, portions of printed wires 128a, 128b would be masked-off by an insulating material leaving discrete exposed portions on which appropriate terminals are formed.

Depending upon the particular interconnect with which a substrate terminal 130 is associated, the substrate terminal is either a signal terminal 130a, a power terminal 130b, or a ground terminal 130c, formed on respective landing pads 132. While the substrate terminals 130 include solder balls, the solder balls may be replaced with pins, lands or the like.

The substrate terminals 130 are formed on the second surface of the substrate 120 in an array, wherein adjacent substrate terminals 130 are spaced apart from each other by a pitch $P_1$. In contrast, the intermediate vias 140 of cluster 150 are spaced apart from each other by a distance which is less than $P_1$. Preferably, a ratio of the pitch $P_1$ of the substrate terminals to a distance between adjacent intermediate vias is within a range of approximately 2–10, or approximately 3–5. In one embodiment, the intermediate vias 140 are arranged in an array having a pitch $P_2$ which is less than $P_1$. Preferably, a ratio of $P_1/P_2$ is on the order of approximately 2–10, more preferably approximately 3–5. In the embodiment shown in FIG. 2, the substrate terminals 130 are spaced apart from each other by a pitch $P_1$ equal to 1.0 mm, while the intermediate vias 140 are spaced apart from each other by a pitch $P_2$ equal to 0.25 mm.

Figure 3:
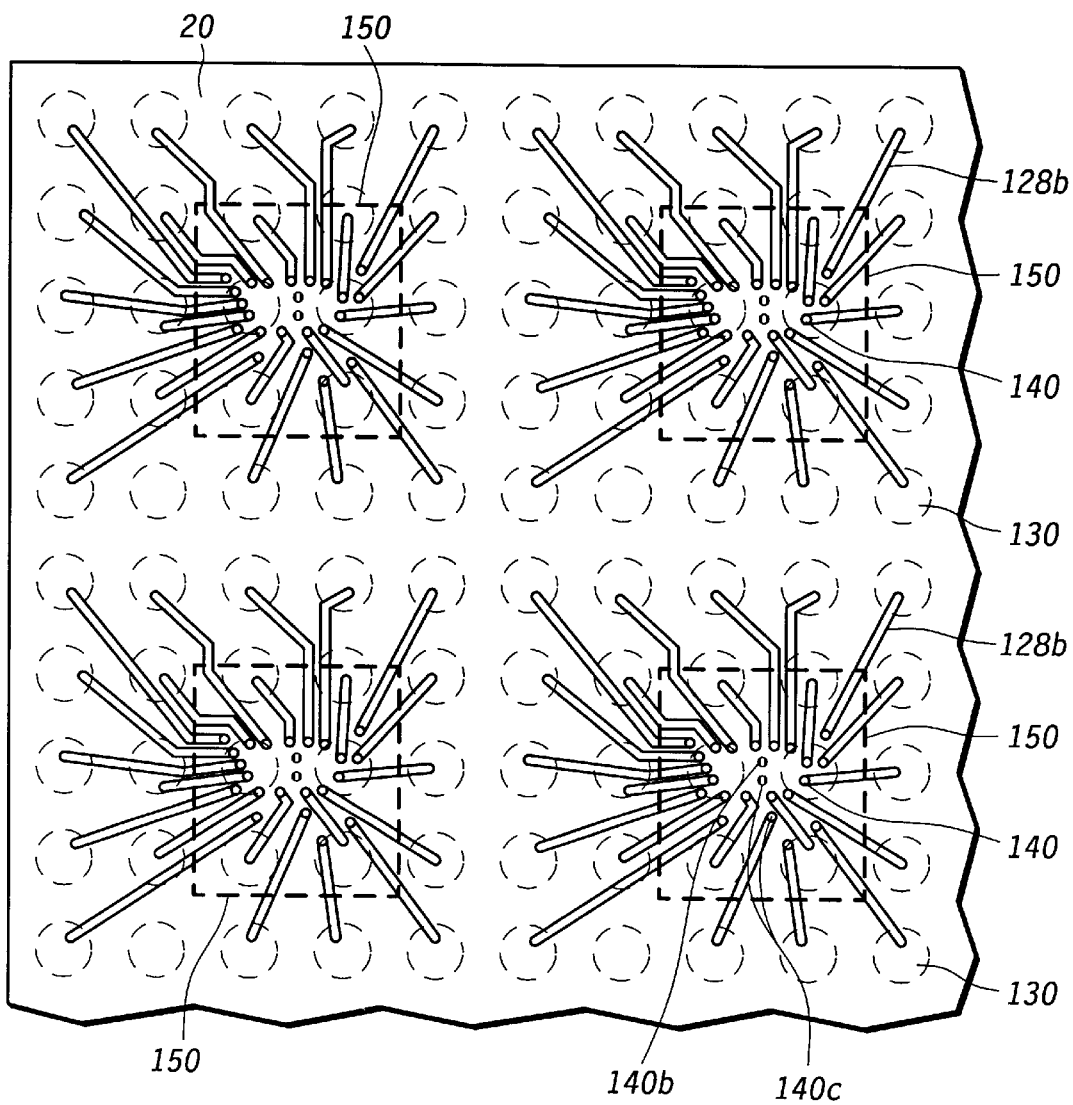
FIG. 3 is a plan view of the substrate illustrated in FIG. 2, taken along section 3—3, illustrating a plurality of clusters of intermediate vias.

Turning to FIG. 3, it is seen that a plurality of clusters 150 are formed in the substrate 120. FIG. 3 represents an enlarged partial view of a cross-section along plane 3—3. While four clusters 150 are shown, additional clusters may be incorporated. Each cluster includes two centrally positioned vias, particularly as intermediate power via 140*b* and as intermediate ground via 140*c*. Those two vias are surrounding by a plurality (twenty-two) of signal intermediate vias.

According to the present invention, by incorporating the novel interconnect routing structure disclosed herein, an improved packaged semiconductor device has been provided in which mutual loop inductance ($L_m$) has been reduced, thereby reducing switching noise contributed to the semiconductor device by the substrate. It has been found that bringing the signal intermediate vias close to the supply intermediate vias, mutual loop inductance has been reduced. In this regard, simulations indicate a 7% reduction in inductance.

While particular embodiments of the present invention have been described herein in detail, it is understood that one of ordinary skill in the art can make modifications to the embodiments without departing from the spirit and scope of the appended claims.

What is claimed is:

1. A semiconductor device, comprising:
    a semiconductor die having a plurality of die terminals; and
    a substrate having a first surface on which is mounted the semiconductor die, a second surface opposite the first surface, and a plurality of interconnects including at least one signal interconnect and at least one supply interconnect, the semiconductor die being electrically connected to the plurality of interconnects through the plurality of die terminals, the plurality of interconnects routing through the substrate to the second surface on which are provided a plurality of substrate terminals that are spaced apart by a pitch $P_1$, each interconnect of the plurality of interconnects having a first printed wire and an intermediate via thereby providing a plurality of first printed wires and a plurality of intermediate vias, each first printed wire of the plurality of first printed wires providing electrical connection between a respective intermediate via of the plurality of intermediate vias and a respective die terminal of the plurality of die terminals, wherein the plurality of intermediate vias are arranged in a cluster, adjacent intermediate vias of the plurality of intermediate vias in the cluster are spaced apart by a distance that is less than the pitch $P_1$, and the cluster includes at least one signal intermediate via of the at least one signal interconnect and at least one supply intermediate via of the at least one supply interconnect.

2. The semiconductor device of claim 1, wherein each interconnect of the plurality of interconnects further comprises a second printed wire thereby providing a plurality of second printed wires, the plurality of second printed wires providing electrical connection between the plurality of intermediate vias and the plurality of substrate terminals.

3. The semiconductor device of claim 1, wherein each interconnect of the plurality of interconnects further comprises a die-scale via thereby providing a plurality of die-scale vias, the plurality of die-scale vias routing from the plurality of first printed wires to the plurality of die terminals.

4. The semiconductor device of claim 1, wherein each of the plurality of die terminals comprises a component from a group consisting of solder bumps and wire bonds.

5. The semiconductor device of claim 1, wherein each of the plurality of substrate terminals comprises a component from a group consisting of solder balls, pins, and lands.

6. The semiconductor device of claim 1, wherein the substrate is selected from the group consisting of an organic resin substrate, ceramic substrate, and an insulated metal core substrate.

7. The semiconductor device of claim 6, wherein a ratio of said distance to $P_1$ is within a range of approximately 2 to 10.

8. The semiconductor device of claim 1, wherein the plurality of intermediate vias are arranged in an array, the plurality of intermediate vias being spaced apart from each other by a pitch $P_2$, wherein $P_2$ is equal to said distance and $P_2 < P_1$.

9. The semiconductor device of claim 1, wherein the plurality of intermediate vias are arranged in a plurality of clusters.

10. The semiconductor device of claim 2, wherein each interconnect of the plurality of interconnects further comprises a package-scale via thereby providing a plurality of package-scale vias, the plurality of package-scale vias routing from the plurality of second printed wires to the plurality of substrate terminals.

11. The semiconductor device of claim 6, wherein the substrate is ceramic.

12. The semiconductor device of claim 8, wherein a ratio $P_1/P_2$ is within a range of approximately 2 to 10.

13. The semiconductor device of claim 9, wherein the at least one supply interconnect includes a plurality of supply interconnects, the plurality of supply interconnects including a plurality of ground interconnects and a plurality of power interconnects, wherein the plurality of ground interconnects are electrically connected together to be at substantially a same potential, and the plurality of power interconnects are electrically connected together to be at substantially a same potential.

14. The semiconductor device of claim 13, wherein the plurality of ground interconnects are electrically connected together in the substrate by a common conductive plane.

15. The semiconductor device of claim 13, wherein the plurality of power interconnects are electrically connected together in the substrate by a common conductive plane.

16. A semiconductor device, comprising:
    a semiconductor die having a plurality of die terminals;
    a substrate having a first surface on which is mounted the semiconductor die, a second surface opposite the first surface, and a plurality of interconnects including signal interconnects and supply interconnects, the semiconductor die being electrically connected to the plurality of interconnects through the plurality of die terminals, the plurality of interconnects routing through the substrate to the second surface on which are provided a plurality of substrate terminals that are spaced apart by a pitch $P_1$, each interconnect of the plurality of interconnects having a first printed wire, a second printed wire and an intermediate via thereby providing a plurality of first printed wires, a plurality of second printed wires and a plurality of intermediate vias, each first printed wire of the plurality of first printed wires electrically connecting a respective intermediate via of the plurality of intermediate vias to a respective die terminal of the plurality of die terminals, and each second printed wire of the plurality of second printed wires electrically connecting a respective intermediate via of the plurality of intermediate vias to a respective substrate terminal of the plurality of substrate terminals, wherein the plurality of intermediate vias are arranged in a plurality of clusters, adjacent intermediate vias of the plurality of intermediate vias in each cluster of the plurality of clusters being spaced apart by a distance that is less than the pitch $P_1$, and each cluster of the plurality of clusters including at least one signal intermediate via and at least one supply intermediate via; and wherein the supply interconnects include ground interconnects and power interconnects, wherein the ground interconnects are electrically connected together to be at substantially a same potential by a common conductive plane, and the power interconnects are electrically connected together to be at substantially a same potential.

17. The semiconductor device of claim 16, wherein each interconnect of the plurality of interconnects further comprises a package-scale via thereby providing a plurality of package-scale vias, the plurality of package-scale vias routing from the plurality of second printed wires to the plurality of substrate terminals.

18. The semiconductor device of claim 16, wherein each interconnect of the plurality of interconnects further comprises a die-scale via thereby providing a plurality of die-scale vias, the plurality of die-scale vias routing from the plurality of first printed wires to the plurality of die terminals.

19. The semiconductor device of claim 16, wherein each of the plurality of die terminals comprises a component from a group consisting of solder bumps and wire bonds.

20. The semiconductor device of claim 16, wherein each of the plurality of substrate terminals comprises a component from a group consisting of solder balls, pins, and lands.

21. The semiconductor device of claim 16, wherein the substrate is selected from the group consisting of an organic resin substrate, a ceramic substrate, and an insulated metal core substrate.

22. The semiconductor device of claim 16, wherein a ratio of said distance to $P_2$ is within a range of approximately 2 to 10.

23. The semiconductor device of claim 16, wherein the plurality of intermediate vias in said each cluster are arranged in an array, the plurality of intermediate vias being spaced apart from each other by a pitch $P_2$, wherein $P_2$ is equal to said distance and $P_2 < P_1$.

24. The semiconductor device of claim 16, wherein the power interconnects are electrically connected together in the substrate by a common conductive plane.

25. The semiconductor device of claim 21, wherein the substrate is ceramic.

26. The semiconductor device of claim 23, wherein a ratio $P_1/P_2$ is within a range of approximately 2 to 10.

* * * * *